(12) United States Patent
Montes Monteserin et al.

(10) Patent No.: US 11,856,727 B2
(45) Date of Patent: Dec. 26, 2023

(54) COOLING SYSTEM FOR COMPUTER COMPONENTS

(71) Applicant: Submer Technologies, S.L., L'Hospitalet de Llobregat (ES)

(72) Inventors: David Montes Monteserin, L'Hospitalet de Llobregat (ES); Pol Valls Soler, L'Hospitalet de Llobregat (ES); Daniel Esteve Pope Palacín, L'Hospitalet de Llobregat (ES); Jordi Bricollé Sancho, L'Hospitalet de Llobregat (ES); Miguel Giner Gutiérrez, L'Hospitalet de Llobregat (ES); Joan Besares Matas, L'Hospitalet de Llobregat (ES)

(73) Assignee: Submer Technologies, S.L., L'Hospitalet de Llobregat (ES)

( * ) Notice: Subject to any disclaimer, the term of this patent is extended or adjusted under 35 U.S.C. 154(b) by 160 days.

(21) Appl. No.: 17/438,232

(22) PCT Filed: Mar. 13, 2019

(86) PCT No.: PCT/ES2019/070172
§ 371 (c)(1),
(2) Date: Sep. 10, 2021

(87) PCT Pub. No.: WO2020/183038
PCT Pub. Date: Sep. 17, 2020

(65) Prior Publication Data
US 2022/0183181 A1 Jun. 9, 2022

(51) Int. Cl.
*H05K 7/20* (2006.01)
(52) U.S. Cl.
CPC ..... *H05K 7/20236* (2013.01); *H05K 7/20263* (2013.01); *H05K 7/20272* (2013.01)

(58) Field of Classification Search
None
See application file for complete search history.

(56) References Cited

U.S. PATENT DOCUMENTS 10,624,242 B2 * 4/2020 Best .......................... G06F 1/20
10,969,842 B2 * 4/2021 Enright ................ H05K 7/1492
(Continued)

FOREIGN PATENT DOCUMENTS

CN 108 901 187 A 11/2018
EP 3384364 B1 3/2022
(Continued)

OTHER PUBLICATIONS

International Search Report and Written Opinion of the international Searching Authority of the Application No. PCT/ES2019/070172 dated Jan. 20, 2020; 19 pages.
(Continued)

*Primary Examiner* — Courtney L Smith
(74) *Attorney, Agent, or Firm* — SQUIRE PATTON BOGGS (US)

(57) ABSTRACT

A cooling system for immersed computing devices, comprising a cooling bath tank that contains a cooling fluid that flows through the inside thereof from at least one outlet to an inlet, in which said cooling bath tank is designed and arranged to enable at least a first portion of at least one computing device to be cooled to be inserted therein, said computing device being at least partially immersed in the cooling fluid contained therein, and at least one cooling unit designed to collect and cool the cooling fluid flowing out of said at least one inlet and to return the cooling fluid, once cooled, through said at least one outlet into said cooling bath tank, characterized in that said at least one cooling unit is designed to be inserted into said cooling bath tank, being at (Continued)

least partially immersed in the cooling fluid contained therein, and to be removed therefrom.

18 Claims, 17 Drawing Sheets

(56) References Cited

U.S. PATENT DOCUMENTS

| | | | |
|---|---|---|---|
| 11,357,131 B1* | 6/2022 | Enright | H05K 7/208 |
| 2017/0064862 A1* | 3/2017 | Miyoshi | H01L 23/32 |
| 2017/0311479 A1 | 10/2017 | Barragy et al. | |
| 2018/0196484 A1* | 7/2018 | Saito | H01L 23/44 |
| 2018/0279507 A1* | 9/2018 | Midgley | H05K 7/20772 |
| 2018/0343774 A1 | 11/2018 | Smith | |
| 2019/0357378 A1* | 11/2019 | Kolar | H05K 7/20327 |
| 2021/0153386 A1* | 5/2021 | Lau | B66C 17/12 |

FOREIGN PATENT DOCUMENTS

| | | |
|---|---|---|
| RU | 2500013 C1 | 11/2013 |
| RU | 2621360 C1 | 6/2017 |
| WO | WO2017/002270 A1 | 1/2017 |
| WO | WO 2018/196339 A1 | 11/2018 |

OTHER PUBLICATIONS

Office Action for Japanese Patent Application No. 2021-555066.
English Translation of Office Action for Japanese Patent Application No. 2021-555066.

* cited by examiner

COOLING SYSTEM FOR COMPUTER COMPONENTS

CROSS-REFERENCE TO RELATED APPLICATIONS

This application is a national-stage filing under 37 USC 371(c) of International Application No. PCT/ES2019/070172, filed Mar. 13, 2019, the entire contents of which are herein incorporated by reference in its entirety for all purposes.

The present invention relates to a cooling system for computing devices at least partially immersed in a cooling bath tank.

BACKGROUND TO THE INVENTION

Cooling systems for computing devices that include a cooling bath tank to cool said computing devices using a cooling fluid in which said devices are immersed are known in the prior art. Furthermore, these cooling systems have a heat exchanger and a fluid pump that are arranged inside the tank and in contact with the cooling fluid.

Document CN108323118 describes a cooling bath tank that has two separate spaces: a first space for the electronic devices and a second space containing the heat exchanger and the fluid pump. The two spaces share the same cooling fluid. This has the drawback of requiring the second space in the cooling tank to be completely drained of cooling fluid to enable maintenance tasks to be performed on the components arranged inside said space.

Furthermore, document CN108323118 describes how the cooling fluid in the second space in the tank can flow from the first space in the tank to the second space in the tank through a fluid inlet arranged in the upper portion of the cooling tank. Consequently, once the cooling fluid has cooled the computing devices in the first space in the tank, said cooling fluid flows to the second space to be cooled. As described, the second space in the tank includes a heat exchanger and a fluid pump with a suction inlet for the cooling fluid that communicates with the first space in the tank via a fluid outlet located in the lower portion of the first space in the tank, thereby enabling the cooling fluid to flow from the second space in the tank to the first space in the tank once the cooling fluid has been cooled.

The fact that the heat exchanger is positioned inside the second space in the tank in contact with the cooling fluid has the drawback that any refrigerant fluid of the cooling fluid that leaks subsequently flows into the cooling tank.

There is therefore a clear need to obtain a cooling system that enables the user to perform maintenance tasks on the heat exchanger and the fluid pump easily and simply, without having to drain the cooling fluid from the cooling tank. Furthermore, in the event of a leak, this cooling system must prevent the refrigerant fluid of the cooling fluid from flowing into the tank of the cooling bath containing the cooling fluid.

DESCRIPTION OF THE INVENTION

The objective of the present invention is to provide a cooling system for computing devices that resolves the cited drawbacks and provides the advantages described below.

To achieve this objective and according to a first aspect, the present invention provides a cooling system for immersed computing devices comprising:

a cooling bath tank that contains a cooling fluid that flows through the inside thereof from at least one outlet to at least one inlet, in which the cooling bath tank is designed and arranged to enable at least a first portion of a computing device to be cooled to be inserted therein, said computing device being at least partially immersed in the cooling fluid contained therein, and at least one cooling unit designed to collect and cool the cooling fluid flowing out of the at least one inlet and to return the cooling fluid, once cooled, through the at least one outlet into the cooling bath tank, The cooling system according to the present invention is characterized in that the at least one cooling unit is designed to be inserted into the cooling bath tank, being at least partially immersed in the cooling fluid contained therein, and to be removed therefrom.

According to the present invention, the user of the cooling system can insert and/or remove the cooling unit from the cooling bath tank to perform maintenance work on the components of said unit without having to drain the cooling fluid from the cooling bath tank. Furthermore, during maintenance of the faulty cooling unit, the user can easily replace this cooling unit with another to enable the cooling bath tank to continue operating.

According to one embodiment, the cooling unit includes a casing with projections designed and arranged to be supported at least by supports projecting inwards from internal walls of the cooling bath tank when the cooling unit is inserted in the cooling bath tank.

The projections from the casing of the cooling unit are therefore positioned above the supports of the internal walls of the cooling bath tank, enabling easy insertion and/or removal of the cooling unit from inside the cooling bath tank. Furthermore, the projections and supports enable the cooling unit to be supported simply and easily.

The casing is substantially symmetrical about a transverse axis and fits the perimeter of the internal section of the cooling bath tank. Advantageously, this casing has two substantially symmetrical projections arranged on opposite sides of the casing above the supports of two opposite walls of the cooling bath tank.

Preferably, the supports are supports extending longitudinally along said internal walls of the bath tank.

Since the supports extend longitudinally along the internal walls of the cooling bath tank, the cooling unit can be placed in any position along the inside of the cooling bath tank, depending on the requirements of the user. For example, when the cooling bath tank is being transported, the cooling unit can be positioned in a central portion of the tank so that the center of gravity of the assembly can be in said central portion.

Advantageously, the supports of the internal walls of the cooling bath tank project outwards.

According to an alternative embodiment, the supports are also used to support projections from a computing device to be cooled that is designed to be inserted into the cooling bath tank, and removed therefrom.

According to one embodiment, the casing has a first compartment and a second compartment that are fluidly isolated from one another, in which the first compartment has an inlet to enable the cooling fluid coming out of the at least one outlet in the cooling bath tank to enter said first compartment.

The first compartment of the casing is therefore designed to receive the cooling fluid once the temperature of said fluid has increased after cooling the computing devices. Furthermore, this first compartment conveys the cooling fluid, once the temperature thereof has dropped, to the cooling bath tank to cool the computing devices. Thus, the cooling fluid remains inside the cooling bath tank, maintaining a constant volume therein.

According to one embodiment, the cooling fluid enters the cooling bath tank through the lower portion of said tank, via a distribution wall arranged parallel to the base of said cooling bath tank. This creates a distribution volume in which the cooling fluid accumulates. The cooling fluid enters said tank through orifices in the distribution wall and is conveyed towards the computing devices. This distribution wall has at least one mechanism connected operationally to a drain valve of the cooling unit, enabling the cooled cooling fluid to enter said distribution volume.

Preferably, the first compartment houses a fluid pump that is immersed in the cooling fluid that has entered through the inlet of the first compartment and that is designed and arranged to pump said cooling fluid to an inlet of the first circuit of a heat exchanger that is housed in said second compartment and designed to cool the cooling fluid flowing through the first circuit.

The fluid pump then pumps the cooling fluid in the first compartment to a first circuit of a heat exchanger to be cooled by a refrigerant fluid flowing through a second circuit of the heat exchanger.

Optionally, the first compartment can house more than one fluid pump designed to be activated in the event of failure of one of the fluid pumps. This enables the cooling system to continue working if one of the fluid pumps fails.

Preferably, the motor of the fluid pump immersed in the cooling fluid is positioned in a lower portion of the first compartment of the casing.

Also preferably, the refrigerant fluid flowing through the second circuit of the heat exchanger is water at a temperature below the temperature of the cooling fluid. Another type of fluid having the same physical characteristics and enabling the cooling fluid to be cooled could nonetheless be used in the present invention.

According to one embodiment, the first compartment has a first sub-compartment and a second sub-compartment, in which the first sub-compartment has the inlet to enable entry of the cooling fluid therein, and in which the first circuit of the heat exchanger has at least one cooling-fluid outlet arranged in the second sub-compartment.

This enables the cooling fluid coming from the heat exchanger to flow through a second sub-compartment, preferably located in the lower portion of the casing of the cooling unit, before flowing out of the outlet to the cooling bath tank.

Preferably, the first and second sub-compartments communicate with one another via a through-hole that is designed and arranged to enable a portion of the fluid pump to pass from the first sub-compartment into the second sub-compartment, such that the portion of the fluid pump is housed in the second sub-compartment.

This means that the first and second sub-compartments are in communication, enabling passage of a fluid pump so that a portion of said pump is housed in the first sub-compartment and another portion is housed in the second sub-compartment.

Advantageously, the through-hole has a moveable part arranged to move between:
 an operating position in which said part supports the portion of the fluid pump that has passed through the through-hole, and in which said moveable part is positioned inside the second sub-compartment together with a lower portion of the fluid pump, and
 a blocking position in which said part covers the through-hole, which is adaptable when not bearing the fluid pump.

The moveable part therefore enables a portion of the fluid pump to pass into the second sub-compartment to be cooled. When said fluid pump is removed, for example for maintenance, the moveable part is moved to prevent the fluid in the second sub-compartment from flowing into the first sub-compartment, or vice versa, through the through-hole.

Also advantageously, the through-hole has a gasket about the inner perimeter thereof that prevents the cooling fluid from flowing between the first sub-compartment and the second sub-compartment when in contact with the moveable part when said part is in a blocking position, or when in contact with the outer perimeter of the fluid pump when the moveable part is in an operating position.

The gasket thus prevents the cooling fluid from flowing from the second sub-compartment to the first sub-compartment, or vice versa, since this gasket remains in contact with the moveable part when said moveable part is in a blocking position. Furthermore, when the moveable part is in an operating position, the outer perimeter of the gasket is in contact with the outer perimeter of the fluid pump to prevent the fluid flowing from the second sub-compartment to the first sub-compartment, or vice versa.

Preferably, the second sub-compartment includes a deflector arranged to guide the cooling fluid entering from the outlet towards the portion of the fluid pump arranged inside the second sub-compartment, such that the cooling fluid comes into thermal contact with the outside of the portion of the fluid pump to cool same.

The deflector thus enables the cooling fluid coming from the outlet to cool the portion of the fluid pump arranged in the second sub-compartment to be directed.

Advantageously, the fluid pump includes an upper portion of the fluid pump that is housed in the first sub-compartment and that includes a suction inlet for the cooling fluid in the first sub-compartment, and a lower portion of the fluid pump to be cooled that is housed in the second sub-compartment.

The cooling fluid coming from the heat exchanger then cools the lower portion of the fluid pump in the first sub-compartment, before flowing out of the outlet to the cooling bath tank.

According to one embodiment, the lower portion of the fluid pump includes a motor that is located in the second sub-compartment to be cooled by the cooling fluid therein.

Preferably, the inlet of the first compartment is positioned in an upper region of the casing, which is positioned such that the cooling fluid overflows into said inlet once the cooling unit has been inserted into the cooling bath tank.

Thus, when the cooling system is in use, the cooling fluid coming from the cooling bath tank enters the cooling unit through an inlet positioned in an upper region of the casing. The cooling fluid overflows an overflow wall arranged inside the cooling bath tank to reach this location and the inlet of the cooling unit.

According to one embodiment, the cooling bath tank has a first sub-tank and a second sub-tank that are fluidically isolated from one another, in which said first sub-tank is arranged inside said second sub-tank and designed to receive at least said at least one cooling unit, and at least said first portion of at least said computing device.

Preferably, the first sub-tank is joined to the second sub-tank and has an external volume that is less than the internal volume of the second sub-tank, thereby forming a separation volume between the first sub-tank and the second sub-tank.

The cooling bath tank is thus divided into two sub-tanks, with a separation volume between the two sub-tanks. The first sub-tank contains the cooling fluid in which the computing devices and the cooling unit are immersed. The second sub-tank acts as external casing for the cooling bath tank. The separation volume between the two sub-tanks is fluidically isolated from the first sub-tank, thereby acting as a heat insulator for the cooling fluid inside the first cooling bath sub-tank.

Optionally, the separation volume between sub-tanks contains a thermal insulator, for example rock wool or glass wool, to reduce transmission of the heat accumulated by the cooling fluid in the first sub-tank to the outside of the cooling bath tank.

According to one embodiment, the separation volume is in fluid communication with a leak aperture of the second compartment of the casing to drain thereto any fluid leaks, thereby preventing such fluid leaks from entering the first sub-tank.

The leak aperture therefore ensures that the fluid leak flows into the first sub-tank, thereby preventing the fluid leak from coming into contact with the computing devices and causing damage. Furthermore, the cooling fluid is not diluted by the fluid leak, which could cause the cooling system to malfunction. Alternatively, the fluid leak is drained to the outside of the cooling bath tank through a leak aperture that communicates with the outside of same.

The fluid leak can be refrigerant fluid from the second circuit of the heat exchanger. Preferably, the refrigerant fluid is water at a temperature below the temperature of the cooling fluid. Another type of fluid having the same physical characteristics and enabling the cooling fluid to be cooled could nonetheless be used in the present invention.

According to one embodiment, the cooling system has conveyance means designed and arranged to move at least one computing device or one cooling unit from an immersed position to a maintenance position, and vice versa.

The cooling system therefore has conveyance means to help the user to insert and remove the computing devices or the cooling units from inside the cooling bath tank, for example for maintenance or replacement.

Preferably, the cooling bath tank includes conveyance guides arranged longitudinally on at least one outside face of at least one perimeter wall of said tank, and in which the conveyance means include a moveable conveyor coupled in a guided manner to the conveyance guides to enable longitudinal movement in both senses along said guides, to the position of the computing device or the cooling unit to be moved.

These conveyance guides enable the moveable conveyor to be positioned above a computing device or a conveyance unit to move same. Furthermore, the conveyance guides enable the moveable conveyor to be moved in both senses in a longitudinal direction to move the computing device or the cooling unit when same is in a maintenance position.

According to one embodiment, the conveyance guides are arranged on opposite walls of the cooling bath tank such that, depending on the desired position of the cooling system, the moveable conveyor can be coupled in a guided manner to the most suitable wall of the tank for the user.

Optionally, the conveyance guides are arranged such that, when a plurality of cooling systems are arranged in a line, these conveyance guides are operationally connected to the conveyance guides of the adjacent cooling systems, such that a single moveable conveyor can be used for a plurality of cooling systems arranged in a line.

According to one embodiment, the cooling bath tank has conveyance guides on at least two mutually perpendicular faces of said tank, such that said moveable conveyor can move along both conveyance guides by performing a 90° turn.

Preferably, the moveable conveyor includes lifting/lowering means designed to be joined removably to the computing device or the cooling unit to be moved, and to move same upwards or downwards in a direction Z orthogonal to said longitudinal direction to convey same from the immersed position to said maintenance position, and vice versa. Advantageously, the lifting/lowering means include a cable that is removably connectable to the computing device or the cooling unit to be moved, and that is connected operationally to said drive means to perform said lifting or lowering movement thereof. Alternatively, these lifting means include a rigid element for actively moving the computing device or the cooling unit to be moved to perform said upwards or downwards movement thereof.

This enables the moveable conveyor to move the computing device or the cooling unit from an immersed position to a maintenance position, and vice versa, easily and simply for the user.

Optionally, the lifting/lowering means are designed to be joined removably to joining elements arranged on the computing device or the cooling unit to be moved, and to move same upwards or downwards.

According to one embodiment, the lifting/lowering means include retaining elements designed to removably join the computing devices to the cooling bath tank. Preferably, the retaining elements are designed so that, when the lifting/lowering means are joined to said joining elements, the retaining elements are in a position in which the computing device is uncoupled from a portion of the cooling bath tank. Nonetheless, when the lifting/lowering means are not joined to said joining element, the retaining elements are in a position in which the computing device is coupled to a portion of the cooling bath tank.

The lifting/lowering means thus enable easy insertion and removal of the computing devices and, in turn, ensure that the computing devices cannot move freely inside the cooling bath tank when the cooling bath tank is being moved.

SHORT DESCRIPTION OF FIGURES

The attached schematic drawings show a practical embodiment and are provided by way of non-limiting example to aid comprehension of the foregoing.

DESCRIPTION OF PREFERRED EMBODIMENTS

Figure 1:
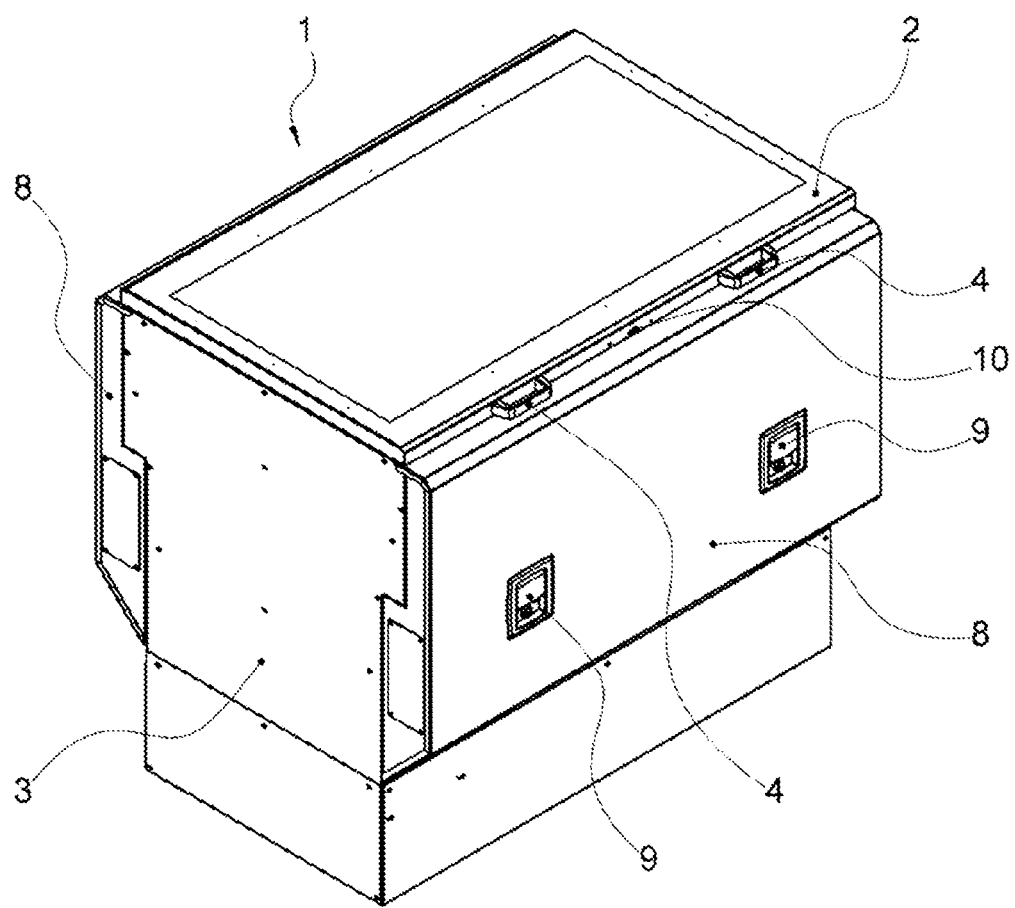
FIG. 1 is a perspective view of an embodiment of the cooling system.

Two preferred embodiments of the cooling system 1 for computing devices 6 according to the present invention are described below with reference to FIGS. 1 to 17.

The first preferred embodiment refers to FIGS. 1 to 15. In this first embodiment, the cooling system 1 does not include conveyance guides 13 for coupling a moveable conveyor 12 that enables lifting/lowering of the computing devices 6 or cooling units 5.

Figure 16:
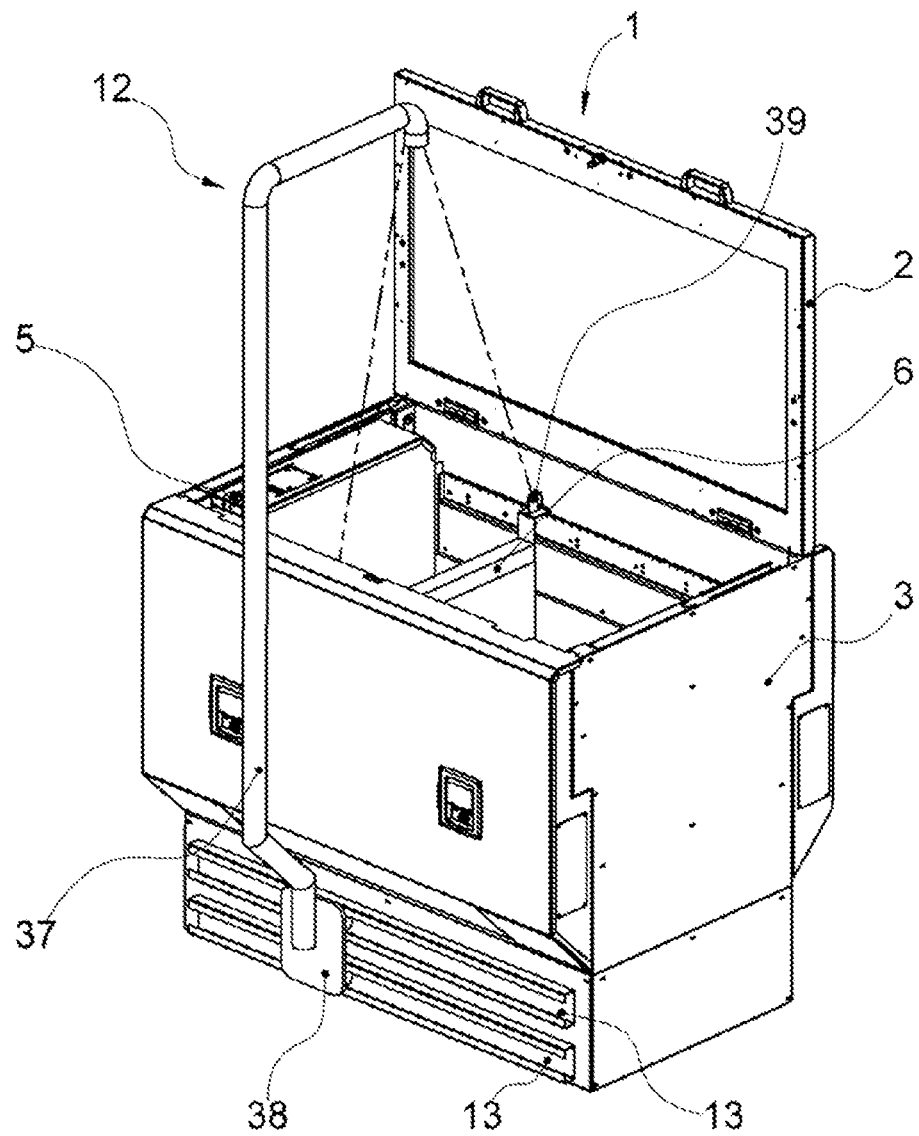
FIG. 16 is a perspective view of the cooling system according to a second embodiment, in which the cooling system includes conveyance means.
Figure 17:
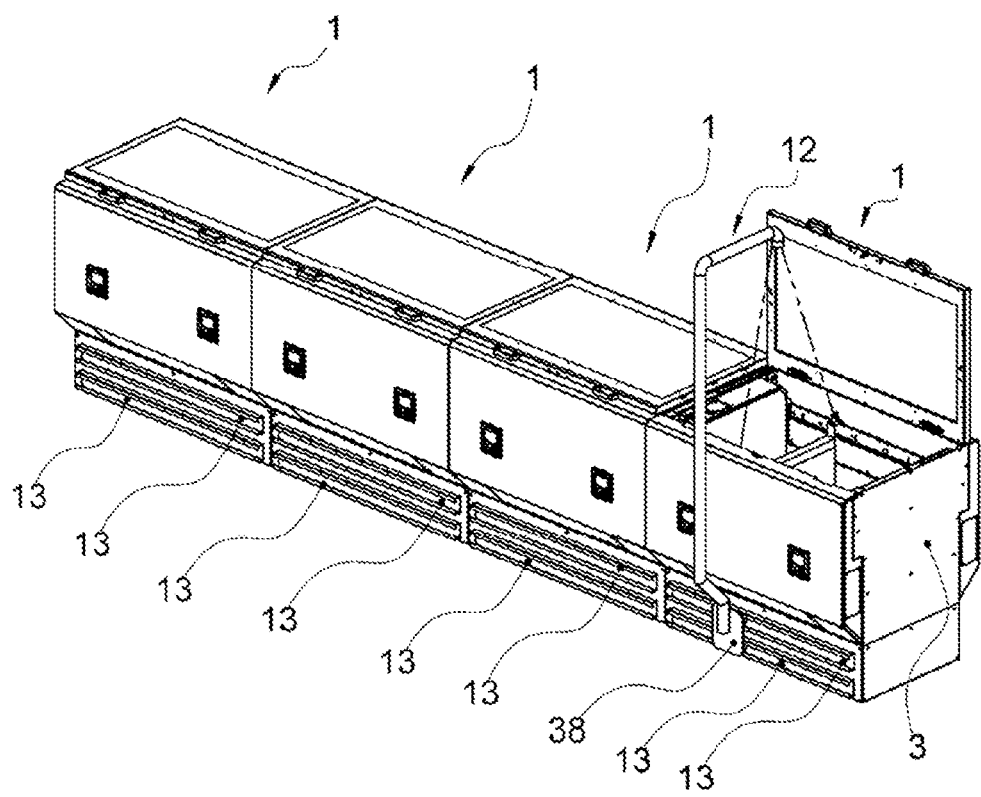
FIG. 17 is a perspective view of the cooling system shown in FIG. 16, in which a plurality of cooling systems are arranged in a line.

The second preferred embodiment refers to FIGS. 16 and 17. In this second embodiment, the cooling system 1 includes conveyance guides 13 for coupling a moveable conveyor 12 that enables lifting/lowering of the computing devices 6 or cooling units 5. Furthermore, as shown in FIG. 17, four cooling systems 1 are arranged in a line such that the conveyance guides 13 are arranged to enable the moveable conveyor 12 to move along said guides, such that a single moveable conveyor 12 can lift/lower the computing devices 6 or cooling units 5 of four cooling systems 1.

The embodiments of the cooling system 1 described below include a cooling unit 5 and a computing device 6 arranged inside a cooling bath tank 3. However, these cooling systems 1 can include more than one cooling unit 5 and more than one computing device 6, depending on the requirements of the user. Furthermore, the cooling fluid used in these embodiments is a dielectric fluid. However, other types of fluid having physical characteristics similar to the physical characteristics of the dielectric fluid can be used. The refrigerant fluid of the cooling fluid used in the described embodiments is water. However, other types of fluid having physical characteristics similar to the physical characteristics of water can be used. Moreover, in the described embodiments, the cooling unit 5 includes two fluid pumps 11, one of which can operate in the event of failure of the main fluid pump 11. However, the cooling unit 5 can include a single fluid pump 11 for correct operation.

In a first preferred embodiment, as shown in FIG. 1, the cooling system 1 has a substantially parallelepipedic shape and includes a cooling bath tank 3 with a lid 2 in the upper portion that is provided to enable the user to access the computing devices 6 and the cooling unit 5. The lid 2 is articulated on one of the external longitudinal walls of the cooling bath tank 3 to enable the user to use two handles 4 arranged on the perimeter of the lid 2 to rotate the lid 2 to access the inside of the cooling bath tank 3. Furthermore, the lid 2 has a lock 10 to prevent unauthorized users from accessing the inside of the tank 3. Furthermore, the lid 2 is arranged to protect the computing devices 6, the cooling unit 5 and the cooling fluid from damage and hazards outside the cooling system 1 (see FIG. 1).

The cooling bath tank 3 has two chambers 8 arranged on the outside longitudinal walls thereof to house, for example, electric cables to enable communication between the computing devices 6 or power sources to provide electricity to the computing devices 6. These chambers 8 have locks 9 to prevent unauthorized users from accessing the inside of the chambers 8 (see FIG. 1).

Figure 2:
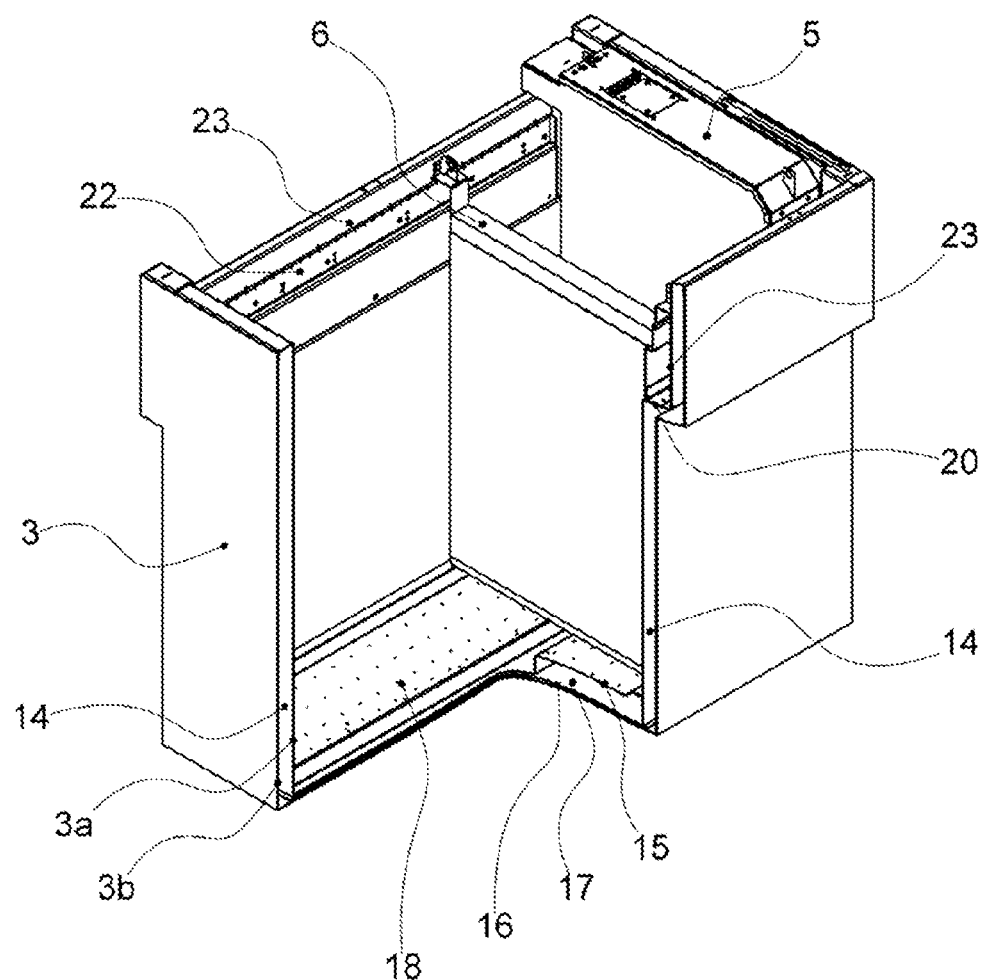
FIG. 2 is a perspective cut-away view of the embodiment of the cooling system shown in FIG. 1, in which the cooling system has a computing device and a cooling unit inside the cooling bath tank.

As shown in FIG. 2, the cooling bath tank 3 has a first sub-tank 3a in which the cooling unit 5 and the computing device are immersed in a cooling fluid, and a second sub-tank 3b arranged outside the first sub-tank 3a. The first sub-tank 3a and the second sub-tank 3b are joined together, but separated such that the external volume of the first sub-tank 3a is less than the internal volume of the second sub-tank 3b. The separation between the two sub-tanks 3a, 3b forms a separation volume 14.

Figure 3:
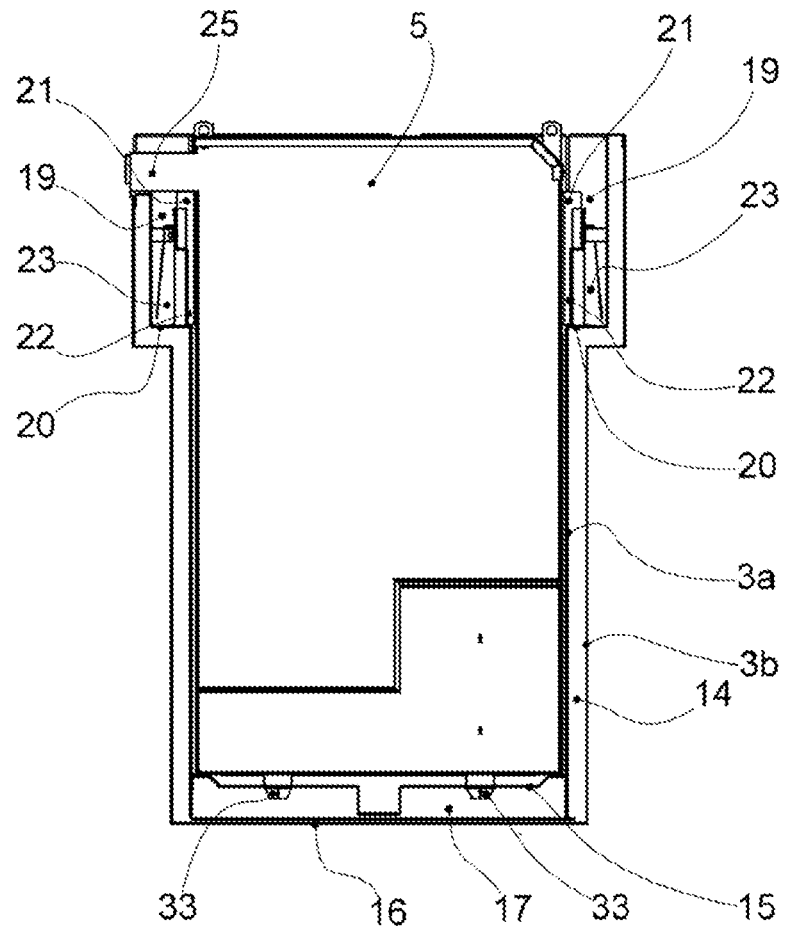
FIG. 3 is a cut-away elevation of the embodiment of the cooling system shown in FIG. 1.

The first and second sub-tanks 3a, 3b are fluidically isolated from one another, such that the cooling fluid in the first sub-tank 3a cannot enter the second sub-tank 3b unless the first sub-tank 3a is ruptured (see FIG. 3).

The separation volume 14 acts as an insulator to reduce transmission of the heat accumulated by the cooling fluid in the first sub-tank 3a to the outside of the cooling bath tank 3, and therefore into the room containing the cooling system 1 (see FIG. 3).

In the described embodiment, the separation volume 14 contains sensors (not shown) to detect fluid leaks, for example leaks of the cooling fluid inside the first sub-tank 3a.

In an alternative embodiment that is not described, the separation volume 14 can contain a thermal insulator, for example rock wool or glass wool, to reduce transmission of the heat accumulated by the cooling fluid in the first sub-tank 3a to the outside of the cooling bath tank 3.

As shown in FIGS. 2 and 3, the first sub-tank 3a has distribution walls 15 arranged in the lower region of the inside of the first sub-tank 3*a*, parallel to the lower wall 16 thereof. The distribution walls 15 and the lower wall 16 of the first sub-tank 3*a* form a distribution volume 17 in which the cooling fluid coming from the cooling unit 5 accumulates. These distribution walls 15 have a plurality of inlet orifices 19 arranged across the length and width of the surface thereof to enable the cooling fluid to enter the volume of the first sub-tank 3*a* in which the computing device 6 is immersed.

The upper region of the cooling bath tank 3 has supports 20 that project outwards from the internal walls of the first sub-tank 3*a*. Projections 21 on the cooling unit 5 bear against said supports 20 so that the cooling unit 5 is simultaneously supported by the supports 20 and immersed in the refrigerant fluid. These supports 20 extend longitudinally along the internal walls of the first sub-tank 3*a*, enabling the cooling unit 5 to be positioned where the user desires (see FIGS. 2 and 3).

In the described embodiment, the supports 20 have separating walls 22 that are mounted perpendicular to the supports 20 and that define overflow spaces 23 between these separating walls 22 and the internal walls of the first sub-tank 3*a*. These overflow spaces 23 define a channel through which the cooling fluid flows out of the cooling bath tank 3 and into the cooling unit through an inlet 19 (see FIGS. 3 and 4).

Figure 13:
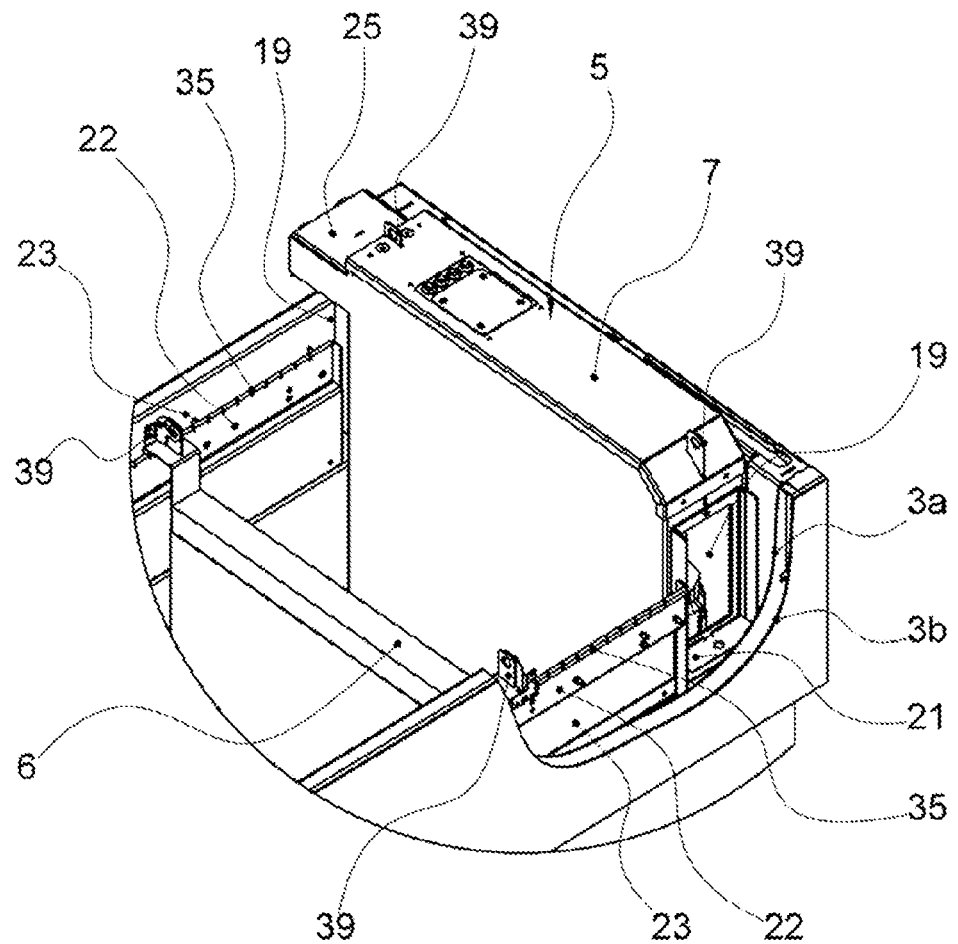
FIG. 13 is a detail view of the upper region of the cooling bath tank of the embodiment of the cooling system shown in FIG. 1, showing the cooling-fluid overflow duct.
Figure 14:
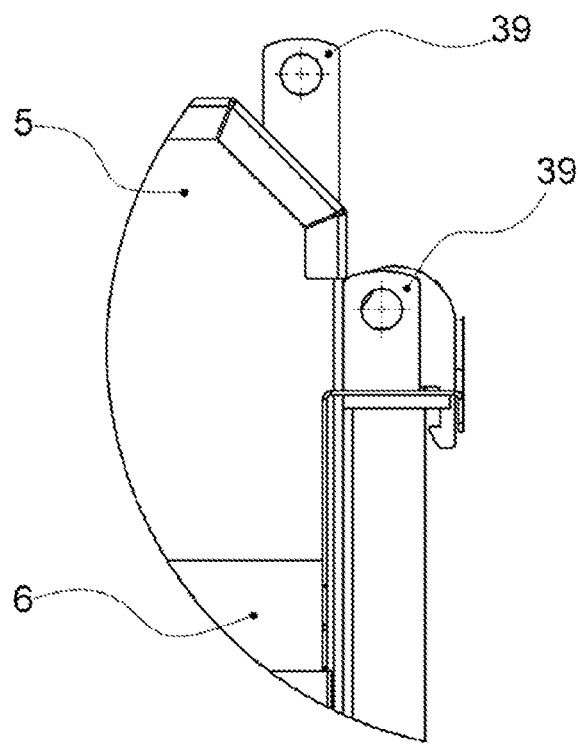
FIG. 14 is a detail view of the joining elements of the embodiment of the cooling system shown in FIG. 1, showing these joining elements arranged in the computing device and in the cooling unit.
Figure 15A:
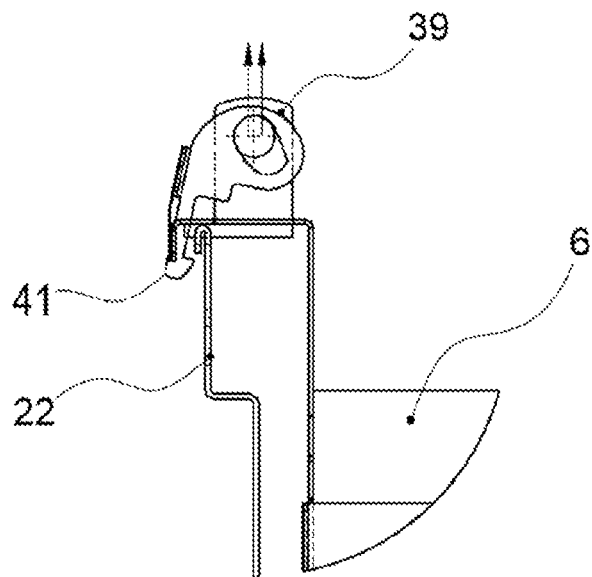
FIG. 15a is a detail view of the retaining elements in a position in which the computing device is uncoupled from a portion of the cooling bath tank.
Figure 15B:
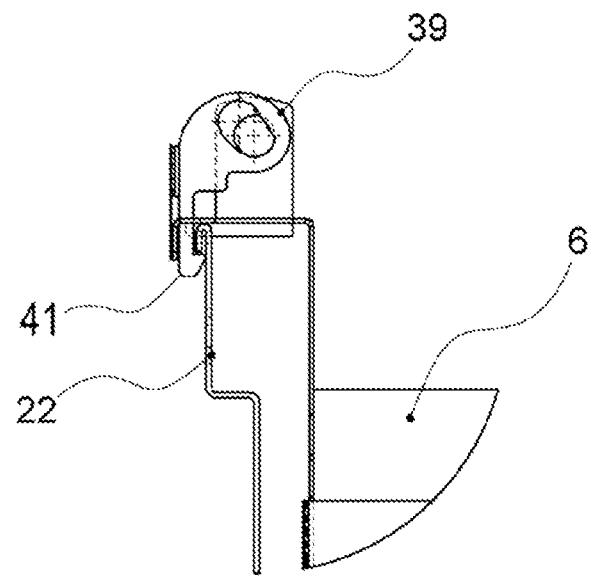
FIG. 15b is a detail view of the retaining elements in a position in which the computing device is coupled to a portion of the cooling bath tank.

These separating walls 22 are arranged on the two supports 20 and each have a plurality of slits 35 designed to couple with a portion of a computing device 6 to enable said computing device 6 to be supported by said separating walls 22 and immersed in the cooling fluid (see FIG. 13).

Furthermore, the retaining elements 41 of the joining elements 39 arranged on the computing devices are coupled to these separating walls 22. These retaining elements 41 are automatically coupled to the wall 22 when the cable (not shown) of the lifting/lowering means of the moveable conveyor is connected. Similarly, these retaining elements 41 are disconnected from the separating walls when the cable (not shown) of the lifting/lowering means of the moveable conveyor is disconnected (see FIGS. 15*a* and 15*b*).

Figure 4:
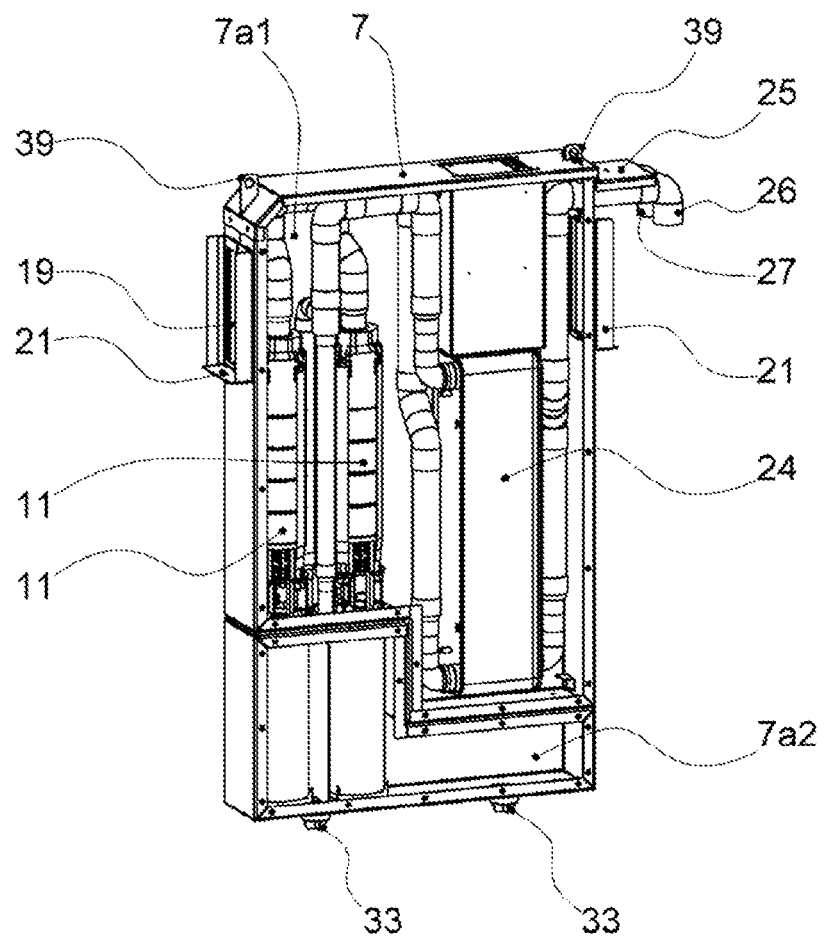
FIG. 4 is a perspective cut-away view of a cooling unit of the embodiment of the cooling system shown in FIG. 1. For the sake of clarity, the walls of the second compartment of the casing are not shown.
Figure 5:
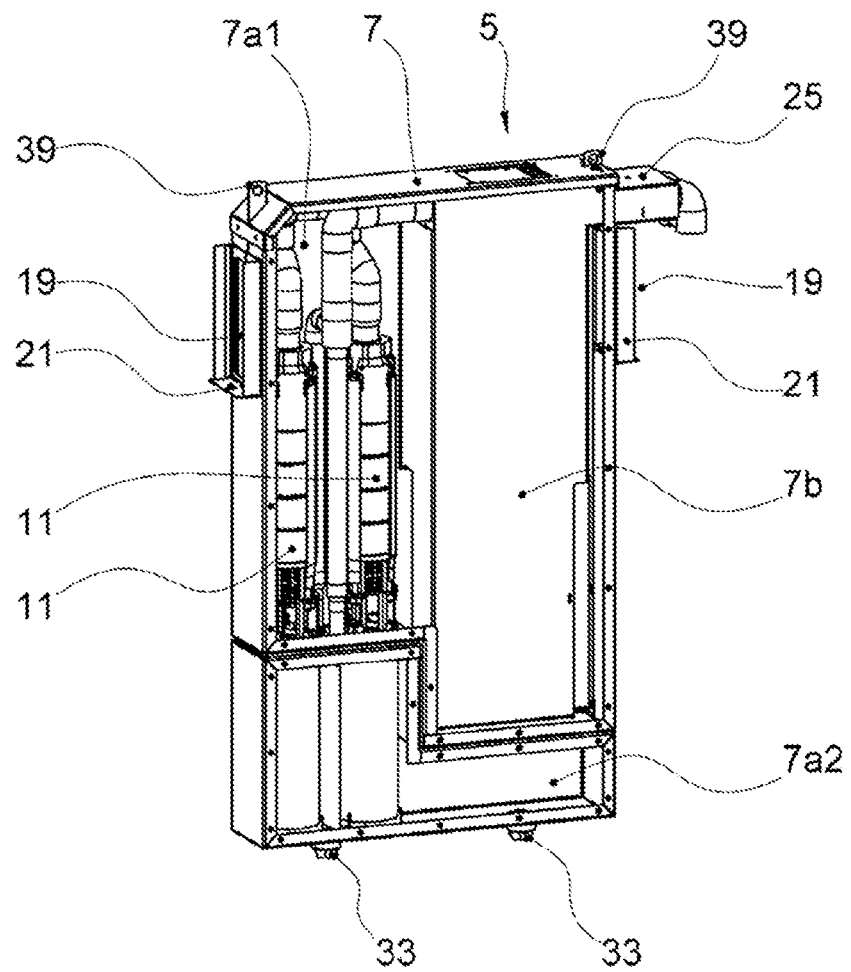
FIG. 5 is a perspective cut-away view of a cooling unit of the embodiment of the cooling system shown in FIG. 1.
Figure 6:
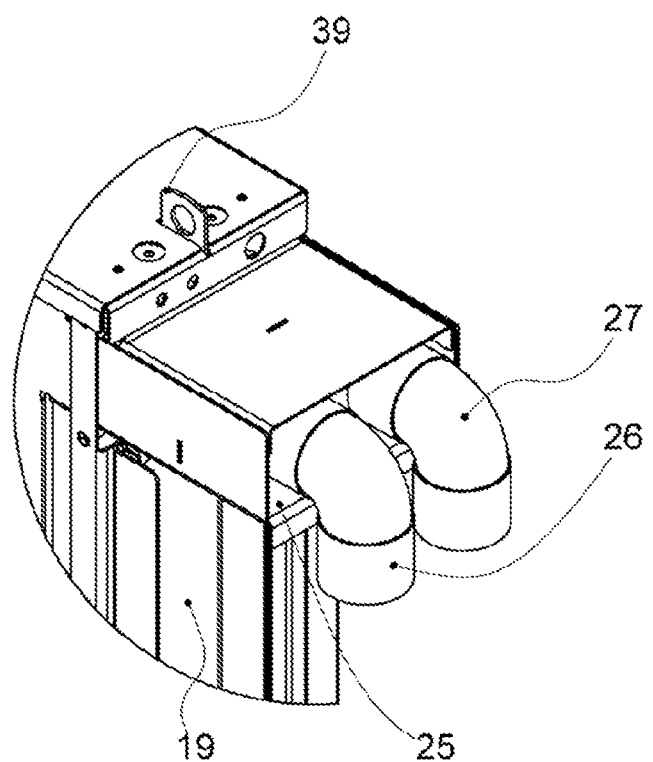
FIG. 6 is a detail view of a region of the second compartment of the casing of the embodiment of the cooling system shown in FIG. 1.
Figure 7:
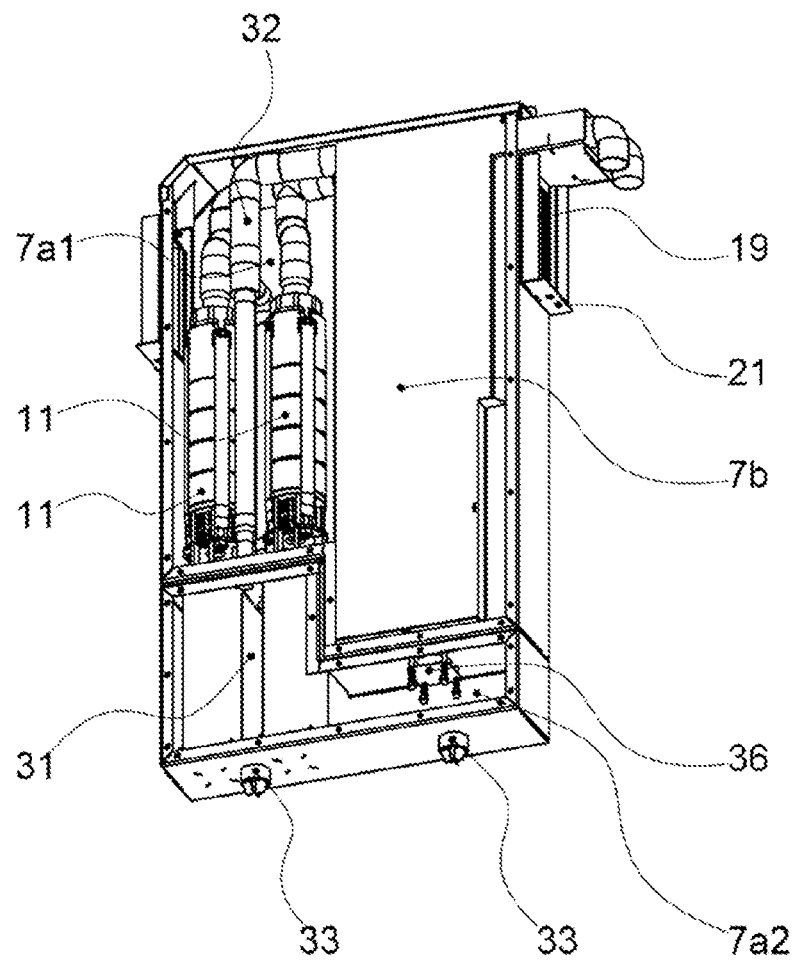
FIG. 7 is a detail view of the second sub-compartment of the casing of the embodiment of the cooling system shown in FIG. 1, in which the drain valve of the first sub-compartment is open.
Figure 8:
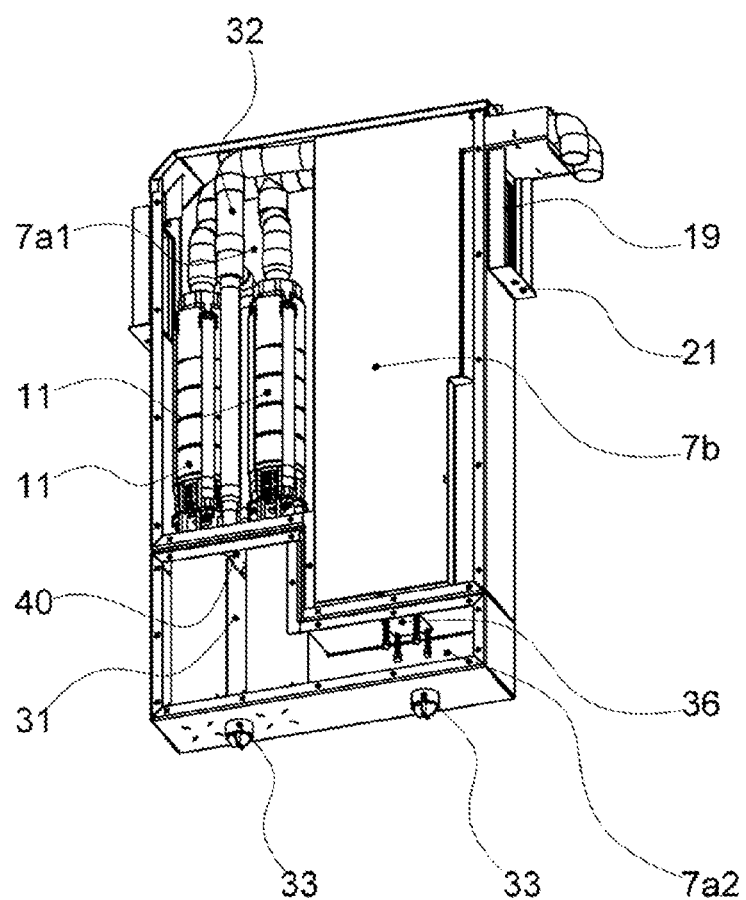
FIG. 8 is a detail view of the second sub-compartment of the casing of the embodiment of the cooling system shown in FIG. 1, in which the drain valve of the first sub-compartment is closed.
Figure 9:
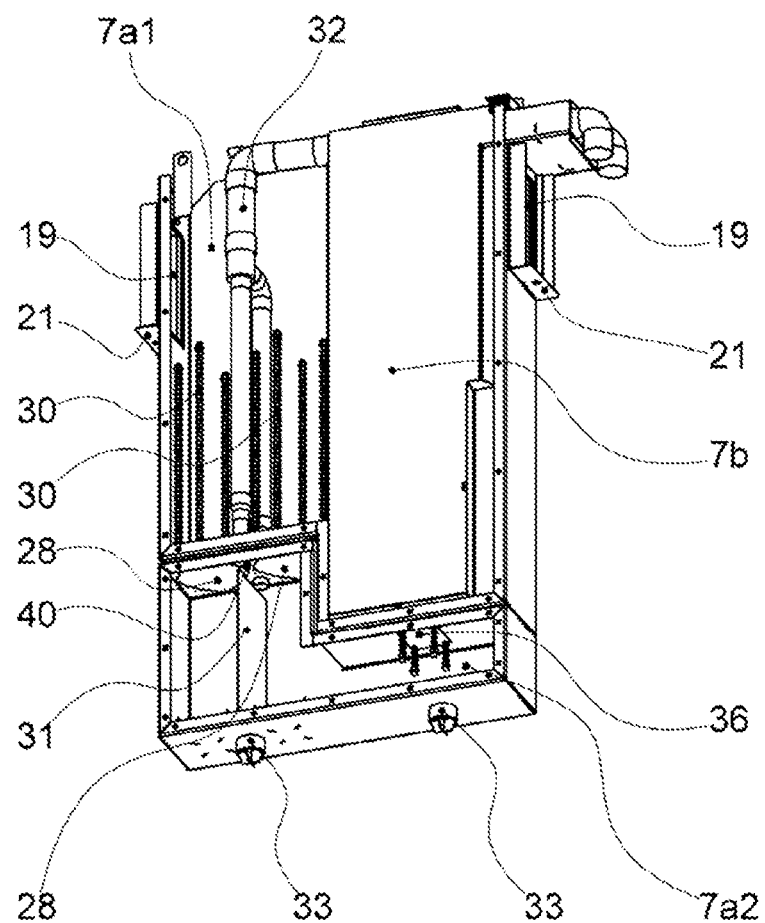
FIG. 9 is a detail view of the second sub-compartment of the casing of the embodiment of the cooling system shown in FIG. 1, in which both moveable parts are in a blocking position.
Figure 10:
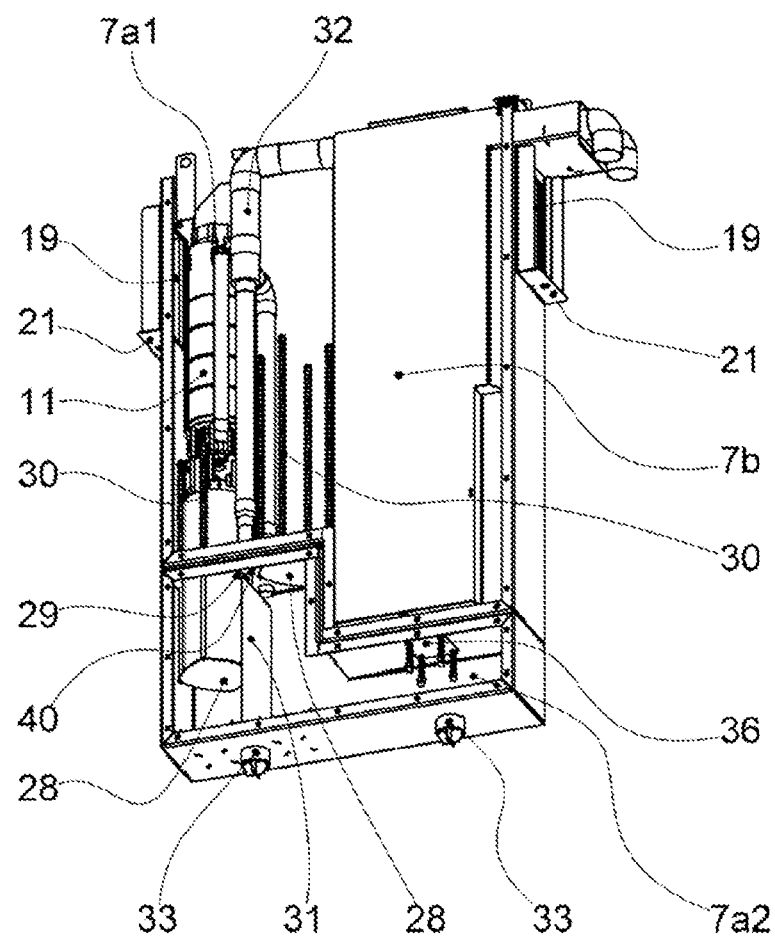
FIG. 10 is a detail view of the second sub-compartment of the casing of the embodiment of the cooling system shown in FIG. 1, in which one of the moveable parts is in an intermediate position between the blocking position and the operating position, and the other moveable part is in a blocking position.
Figure 11:
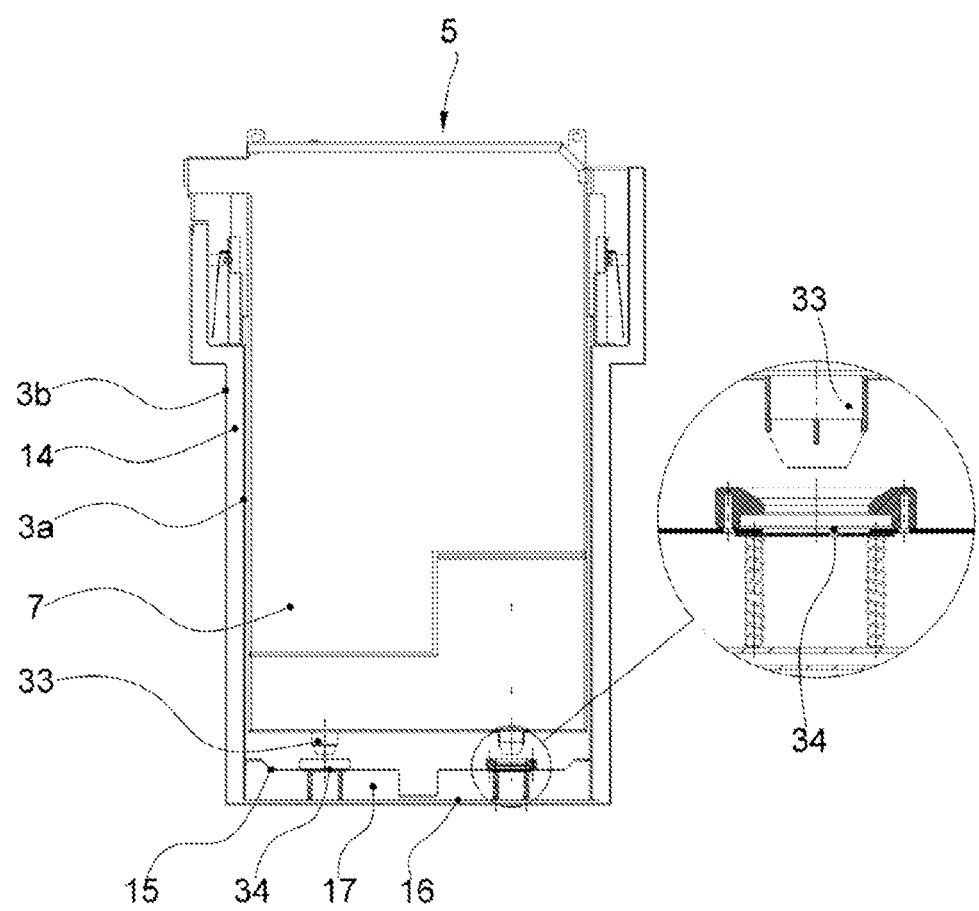
FIG. 11 is a detail view of the lower region of the cooling bath tank of the embodiment of the cooling system shown in FIG. 1, showing the cooling unit disconnected from the distributor of the cooling bath tank.
Figure 12:
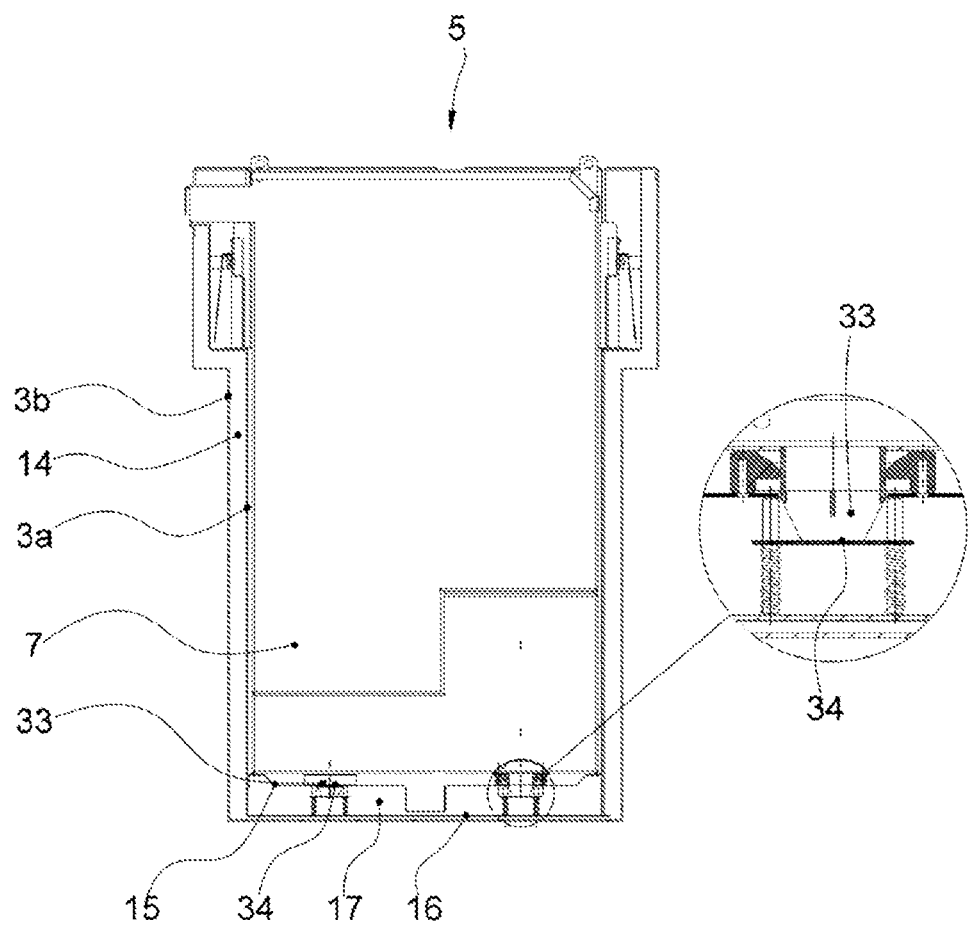
FIG. 12 is a detail view of the lower region of the cooling bath tank of the embodiment of the cooling system shown in FIG. 1, showing the cooling unit connected to the distributor of the cooling bath tank.

As shown in FIG. 4, the cooling unit 5 has a casing 7 that is symmetrical about a longitudinal axis, enabling the cooling unit 5 to be arranged inside the first sub-tank 3*a* optimally for the user. This cooling unit 5 has inlets 19 arranged in the upper portion of the casing 7 to enable the cooling fluid to enter said casing 7.

This casing 7 has a first compartment 7*a* and a second compartment 7*b* that are fluidically isolated from one another. The first compartment 7*a* has a first sub-compartment 7*a*1 and a second sub-compartment 7*a*2 that are in fluid communication (see FIGS. 4 and 5).

The first sub-compartment 7*a*1 of the first compartment 7*a* has the inlets 19 to enable the cooling fluid to enter the inside of the casing 7. This first sub-compartment 7*a*1 houses two fluid pumps 11 that aspirate the cooling fluid from the inside of the first sub-compartment 7*a*1 of the first compartment 7*a*. These fluid pumps 11 pump the cooling fluid into the first circuit of a heat exchanger 24. The temperature of the cooling fluid drops in the heat exchanger 24 when flowing through a first circuit that interacts with a refrigerant fluid of the cooling fluid, which is at a lower temperature, that is flowing through a second circuit of the heat exchanger 24. Once the temperature of the cooling fluid has dropped, the cooling fluid is conveyed to the second sub-compartment 7*a*2 (see FIGS. 4 and 5).

In the described embodiment, the heat exchanger 24 is positioned inside the second compartment 7*b* of the casing 7 so as not to come into contact with the fluid in the first sub-compartment 7*a*1 of the first compartment 7*a*.

The second compartment 7*b* of the casing 7 extends outside said casing 7 of the cooling unit 5 via a duct 25 positioned above one of the cooling-fluid inlets 19 of the first sub-compartment 7*a*1. This duct 25 contains a first pipe 26 that can for example be connected to a refrigerant fluid installation to convey said refrigerant fluid to the second circuit of the heat exchanger 24. Furthermore, this duct contains a second pipe 27 coming from the heat exchanger 24 to convey the refrigerant fluid to, for example, a refrigerant fluid installation to be cooled again (see FIG. 6).

The duct 25 has a leak aperture (not shown) that connects the second compartment 7*b* with the separation volume 14 in fluid communication. This leak aperture (not shown) enables fluid leaks to be drained from the second compartment 7*b* to the separation volume 14. This fluid leak can be either cooling fluid or refrigerant fluid. The sensors (not shown) arranged inside the separation volume 14 enable the presence of fluid in said separation volume 14 to be detected, and a computer program can for example be used to warn the user and to deactivate operation of the cooling system 1. This prevents the fluid leak from entering the first sub-compartment 7*a*1 of the first compartment 7*a* (see FIGS. 5 and 6).

The first sub-compartment 7*a*1 and the second compartment 7*a*2 have two through-holes 29 that are covered by moveable parts 28. Each of these through-holes 29 has gaskets (not shown) arranged on the outer perimeter of these holes 29.

The moveable parts 28 are designed to move independently from a blocking position to an operating position to enable a portion of the fluid pump 11 containing the motor thereof to be housed inside the second sub-compartment 7*a*2. This enables this portion of the fluid pump 11 to be cooled by the cooling fluid introduced into the second sub-compartment 7*a*2 through an outlet 40 of the pipes 32 coming from the first circuit of the heat exchanger 24.

In the blocking position, the moveable parts 28 are in contact with the gasket to prevent the cooling fluid in the first sub-compartment 7*a*1 from flowing into the second sub-compartment 7*a*2, and vice versa. Similarly, when the moveable parts 28 are in an operating position, the gasket (not shown) is in contact with the external walls of the fluid pump 11 to prevent the cooling fluid in the first sub-compartment 7*a*1 from flowing into the second sub-compartment 7*a*2, and vice versa.

The moveable parts 28 have four springs 30 that are compressed to accumulate potential energy when the portion of the fluid pump 11 is inserted into the second sub-compartment 7*a*2, moving the moveable part 28 from the blocking position to the operating position. When the portion of the fluid pump 11 is removed from the outside of the second sub-compartment 7*a*2, the energy accumulated in the springs 30 automatically moves the moveable part 28 from the operating position to the blocking position (see FIGS. 7 to 10).

As shown in FIGS. 7 to 10, the second sub-compartment 7*a*2 of the first compartment 7*a* has a deflector 31 to guide the cooling fluid to the portions of the fluid pump 11 inserted in the second sub-compartment 7*a*2. The cooling fluid is introduced into the second sub-compartment 7*a*2 through an outlet 40 of the pipes 32 coming from the first circuit of the heat exchanger 24.

The casing 7 includes two drain valves 33 in the lower portion thereof that are in fluid communication with the distribution volume 17 when the cooling unit 5 is immersed in the cooling bath tank 3. These drain valves 33 are used to drain the cooling fluid from the inside of the casing 7 of the cooling unit 5 when said unit is removed from the first sub-tank 3a. Furthermore, the casing 7 has a drain valve 36 arranged between the first sub-compartment 7a1 and the second sub-compartment 7a2 that is used to drain the cooling fluid from the first sub-compartment 7a1 to the second sub-compartment 7a2 (see FIGS. 7 to 10). This drain valve 36 is actuated when the cooling unit 5 is moved vertically to remove said unit from the cooling bath tank 3. When said vertical movement of the cooling unit 5 takes place, the cooling fluid presses a plate fastened to two springs that moves longitudinally to enable the cooling fluid to be drained from the first sub-compartment 7a1 to the second sub-compartment 7a2.

The two drain valves 33 arranged in the lower portion of the casing 7 enable the coupling thereof to two mechanisms 34 arranged in the distribution wall 15 to bring the second sub-compartment 7a2 and the distribution volume 17 into fluid communication when these mechanisms 34 are actuated. Thus, when the cooling unit 5 is in use, the cooling fluid, once cooled, is conveyed to the distribution volume 17 of the first sub-tank 3a (see FIGS. 11 and 12).

In a second preferred embodiment, the cooling system 1 has conveyance means that facilitate insertion and removal of the computing device 6 and the cooling unit 5 for the user. These conveyance means comprise two conveyance guides 13 mounted in a lower zone of one of the perimeter walls of the cooling bath tank 3. The conveyance guides 13 are arranged in parallel on the base of the cooling tank 3 and parallel to each other, covering the entire length of the cooling bath tank 3 (see FIG. 16).

The conveyance means also have a moveable conveyor 12 that is mounted on the two conveyance guides 13, enabling said conveyor to move in a direction Y along said conveyance guides 13, in both senses.

In the described embodiment, the moveable conveyor 12 has a rigid arm 37 with a first distal end mounted on both conveyance guides 13 using a connection plate 38. The second distal end of the rigid arm 37 is positioned at a distance above the cooling bath tank 3, enabling the user to move the computing device 6 or the cooling unit 5 of the cooling bath tank 3 from a maintenance position to an immersed position, and vice versa.

The computing device 6 or the cooling unit 5 are removed from or inserted into the cooling bath tank 3 using lifting/lowering means arranged on the moveable conveyor 12, including a motor with a pulley (not shown). This pulley (not shown) includes cables (not shown) that are coupled to two joining elements 39 of the computing device 6 or the cooling unit 5. These joining elements 39 are arranged on opposite ends of the upper region of the computing device 6 or the cooling unit 5. When the motor of the lifting/lowering means is activated, and once the cables of the pulley have been joined to the joining elements 39, the computing device 6 or the cooling unit 5 can be lifted or lowered.

Operation of the cooling system 1 is described below with reference to FIGS. 1 to 16.

The high-temperature cooling fluid enters the cooling unit 5 through inlets 19 arranged in the side walls of the casing 7. These inlets 19 convey the cooling fluid to the first sub-compartment 7a1 of the first compartment 7a of the casing 7. Once inside the first sub-compartment 7a1, the cooling fluid is aspirated by a fluid pump 11 and pumped into the heat exchanger 24. Once inside the heat exchanger 24, the cooling fluid flows through a first circuit to be cooled by a refrigerant fluid flowing through a second circuit of the heat exchanger 24.

Once cooled, the cooling fluid is conveyed to the second sub-compartment 7a2 to cool the portions of the fluid pump 11 housed in said second sub-compartment 7a2.

The cooling fluid then flows out of the second sub-compartment 7a2 through two drain valves 33 arranged in the lower portion of the casing 7 towards the distribution volume 17.

The cooling fluid then enters the region of the first sub-tank 3a through outlets 18 to cool the computing device 6 arranged in this region.

The temperature of the cooling fluid in contact with the computing device 6 increases, and the cooling fluid moves to an upper portion of the first sub-tank 3a.

Finally, the cooling fluid overflows the separating wall 22 into an overflow space 23, before being conveyed back into the first sub-compartment 7a1 of the casing 7 of the cooling unit 5.

Although reference has been made to a specific embodiment of the invention, it is obvious for a person skilled in the art that numerous variations and modifications may be made to the cooling system described, and that all of the details mentioned may be replaced by other technically equivalent details without thereby moving outside the scope of protection defined by the attached claims. For example, although the cooling system 1 in described embodiments has one cooling unit 5, these cooling systems 1 can have more than one cooling unit 5. For example, although the cooling system 1 in described embodiments has one computing device 6, these cooling systems 1 can have more than one computing device 6. For example, although the cooling fluid used in some of the embodiments is a dielectric fluid, another type of fluid with physical characteristics similar to the physical characteristics of a dielectric fluid can be used. For example, although the refrigerant fluid of the cooling fluid used in some of the embodiments is water, another type of fluid with physical characteristics similar to the physical characteristics of water can be used. For example, although the cooling unit 5 is described as having two fluid pumps 11, one of which is used in the event of failure of the main fluid pump 11, the cooling unit 5 can have a single fluid pump 11.

The invention claimed is:

1. A cooling system for immersed computing devices, comprising:
    a cooling bath tank that contains a cooling fluid that flows through an inside thereof from at least one outlet to a first at least one inlet, in which said cooling bath tank is designed and arranged to enable at least a first portion of at least one computing device to be cooled to be inserted therein, said computing device being at least partially immersed in the cooling fluid contained therein, and
    at least one cooling unit designed to collect and cool the cooling fluid flowing out of said at least one inlet and to return the cooling fluid, once cooled, through said at least one outlet into said cooling bath tank, the at least one cooling unit designed to be inserted into said cooling bath tank, to be at least partially immersed in the cooling fluid contained therein, and to be removed therefrom, and including a casing with projections designed and arranged to be supported at least by supports projecting inwards from internal walls of the cooling bath tank when the cooling unit is inserted into the cooling bath tank, the casing having a first compartment fluidly connected with the at least one outlet and a second compartment housing a heat exchanger that are fluidly isolated from one another, said first compartment having a second inlet to enable the cooling fluid coming out of the at least one outlet in the cooling bath tank to enter said first compartment, wherein said first compartment has a first sub-compartment and a second sub-compartment fluidly connected with the at least one outlet, in which said first sub-compartment at least partially houses a fluid pump comprising a suction inlet therein that is immersed in the cooling fluid that has entered through said second inlet of the first compartment and that is designed and arranged to pump said cooling fluid to a third inlet of a first circuit of the heat exchanger that is housed in said second compartment and designed to cool fluid flowing through said first circuit by means of a refrigerant fluid that is flowing through a second circuit of the heat exchanger, enabling the cooled down cooling fluid flowing through said first circuit of said heat exchanger to flow to the second sub-compartment through a cooling-fluid outlet arranged therein.

2. The system (1) as claimed in claim 1, in which said first sub-compartment and second sub-compartment communicate with one another via a through-hole that is designed and arranged to enable a portion of the fluid pump to pass from the first sub-compartment into the second sub-compartment, such that the portion of the fluid pump is housed in the second sub-compartment.

3. The system as claimed in claim 2, in which said through-hole has a moveable part arranged to move between:
an operating position in which said part supports the portion of the fluid pump that has passed through the through-hole, and in which said moveable part is positioned inside the second sub-compartment together with a lower portion of the fluid pump, and
a blocking position in which said part covers the through-hole, which is adaptable when not supporting the fluid pump.

4. The system as claimed in claim 3, in which said through-hole has a gasket about the inner perimeter thereof that prevents the cooling fluid from flowing between the first sub-compartment and the second sub-compartment when in contact with the moveable part when said part is in a blocking position, or when in contact with the outer perimeter of the fluid pump when the moveable part is in an operating position.

5. The system as claimed in claim 2, in which the second sub-compartment includes a deflector arranged to guide the cooling fluid entering from the cooling-fluid outlet towards the portion of the fluid pump arranged inside the second sub-compartment, such that the cooling fluid comes into thermal contact with the outside of said portion of the fluid pump to cool same.

6. The system as claimed in claim 2, in which said fluid pump includes an upper portion of the fluid pump that is housed in the first sub-compartment and that includes a suction inlet for the cooling fluid housing said first sub-compartment, and a lower portion of the fluid pump to be cooled that is housed in the second sub-compartment.

7. The system as claimed in claim 6, in which said second inlet of the first compartment is positioned in an upper region of the casing, which is positioned such that the cooling fluid overflows into said second inlet once the cooling unit has been inserted into the cooling bath tank.

8. The system as claimed in claim 7, in which said cooling bath tank has a first sub-tank and a second sub-tank that are fluidically isolated from one another, in which said first sub-tank is arranged inside said second sub-tank and designed to receive at least said at least one cooling unit, and at least said first portion of at least said computing device.

9. The system as claimed in claim 8, in which said first sub-tank is joined to said second sub-tank and has an external volume that is less than the internal volume of the second tank such as to create a separation volume between said first sub-tank and said second sub-tank.

10. The system as claimed in claim 9, in which said separation volume is in fluid communication with a leak aperture of said second compartment of said casing to drain thereto any fluid leaks, thereby preventing such fluid leaks from entering the first sub-tank.

11. The system as claimed in claim 1, including conveyance means designed and arranged to move at least said at least one computing device from an immersed position to a maintenance position, and vice versa.

12. The system as claimed in claim 11, in which said conveyance means are designed and arranged to move the at least one cooling unit from an immersed position to a maintenance position, and vice versa.

13. The system as claimed in claim 11, in which said cooling bath tank includes conveyance guides arranged longitudinally on at least one outside face of at least one perimeter wall of said tank, and in which said conveyance means include a moveable conveyor coupled in a guided manner to said conveyance guides to enable a longitudinal movement in both directions along said guides, to the position of the computing device or the cooling unit to be moved.

14. The system as claimed in claim 13, in which said moveable conveyor includes lifting/lowering means designed to be joined removably to the computing device or the cooling unit to be moved, and to move same upwards or downwards in a direction Z orthogonal to said longitudinal direction to move same from said immersed position to said maintenance position, or vice versa.

15. The system as claimed in claim 14, in which said lifting/lowering means include a cable that is removably connectable to the computing device or the cooling unit to be moved, and that is connected operationally to drive means to perform said lifting or lowering movement thereof.

16. The system as claimed in claim 14, in which said lifting/lowering means are designed to be joined removably to joining elements arranged on the computing device or the cooling unit to be moved, and to move same upwards or downwards.

17. The system as claimed in claim 16, in which said joining elements are designed to removably join the computing devices to the cooling bath tank.

18. The system as claimed in claim 17, in which said joining elements include retaining elements that are designed to removably join the computing devices to the cooling bath tank.

* * * * *